US007949966B2

(12) United States Patent
Anpo et al.

(10) Patent No.: US 7,949,966 B2
(45) Date of Patent: May 24, 2011

(54) DATA VERIFICATION METHOD, CHARGED PARTICLE BEAM WRITING APPARATUS, AND COMPUTER-READABLE STORAGE MEDIUM WITH PROGRAM

(75) Inventors: Akihito Anpo, Tokyo (JP); Jun Kasahara, Kanagawa (JP); Hitoshi Higurashi, Kanagawa (JP); Shigehiro Hara, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 392 days.

(21) Appl. No.: 12/042,712

(22) Filed: Mar. 5, 2008

(65) Prior Publication Data

US 2008/0221816 A1    Sep. 11, 2008

(30) Foreign Application Priority Data

Mar. 6, 2007    (JP) .................. 2007-055040

(51) Int. Cl.
*G06F 17/50*    (2006.01)
(52) U.S. Cl. ........................................................ 716/50
(58) Field of Classification Search ................. 716/1.21, 716/1, 21, 50
See application file for complete search history.

(56) References Cited

U.S. PATENT DOCUMENTS

| 2002/0116697 A1* | 8/2002 | Okamoto et al. | 716/21 |
| 2009/0191317 A1* | 7/2009 | Lin | 426/119 |
| 2010/0275154 A1* | 10/2010 | Livnat | 715/802 |

FOREIGN PATENT DOCUMENTS

JP    11-67648    3/1999

* cited by examiner

*Primary Examiner* — Jack Chiang
*Assistant Examiner* — Suchin Parihar
(74) *Attorney, Agent, or Firm* — Olbon, Spivak, McClelland, Maier & Neustadt, L.L.P.

(57) ABSTRACT

A charged particle beam writing apparatus includes an input unit configured to input writing data for writing a plurality of cell patterns including at least one cell pattern in which an identifier is added to each of data defining the at least one cell pattern extending over at least two small regions in a plurality of small regions obtained by virtually dividing a writing region, an extraction unit configured to extract the at least one cell pattern to which the identifier is added from the plurality of cell patterns, an output unit configured to output an error result when only one cell pattern is extracted, and a writing unit configured to write the plurality of cell patterns by irradiating a target workpiece with a charged particle beam, based on the writing data for which the error result is not output.

15 Claims, 12 Drawing Sheets

DATA VERIFICATION METHOD, CHARGED PARTICLE BEAM WRITING APPARATUS, AND COMPUTER-READABLE STORAGE MEDIUM WITH PROGRAM

CROSS-REFERENCE TO RELATED APPLICATION

This application is based upon and claims the benefit of priority from the prior Japanese Patent Application No. 2007-055040 filed on Mar. 6, 2007 in Japan, the entire contents of which are incorporated herein by reference.

BACKGROUND OF THE INVENTION

1. Field of the Invention

The present invention relates to a method for verifying data and a writing apparatus using charged particle beams, and more particularly to a method and apparatus for verifying writing data used for an electron beam writing apparatus.

2. Description of the Related Art

Lithography technique that advances microminiaturization of semiconductor devices is extremely important in that only this process forms a pattern in semiconductor manufacturing processes. In recent years, with an increase in high integration and large capacity of large-scale integrated circuits (LSI), a circuit line width required for the semiconductor devices is becoming narrower year by year. To form desired circuit patterns on these semiconductor devices, a master pattern (also called a mask or a reticle) with high precision is required. Then, the electron beam writing technique that has excellent resolution inherently is used for manufacturing such high precision master patterns.

FIG. 16 shows a schematic diagram illustrating operations of a variable-shaped type electron beam writing apparatus. As shown in the figure, the variable-shaped electron beam (EB) writing apparatus includes two aperture plates and operates as follows: A first or "upper" aperture plate 410 has a rectangular opening or "hole" 411 for shaping an electron beam 330. This shape of the rectangular opening may also be a square, a rhombus, a rhomboid, etc. A second or "lower" aperture plate 420 has a variable-shaped opening 421 for shaping the electron beam 330 that passed through the opening 411 of the first aperture plate 410 into a desired rectangular shape. The electron beam 330 emitted from a charged particle source 430 and having passed through the opening 411 is deflected by a deflector to penetrate part of the variable-shaped opening 421 of the second aperture plate 420 and thereby to irradiate a target workpiece or "sample" 340, which is mounted on a stage that is continuously moving in one predetermined direction (e.g. X direction) during the writing. In other words, a rectangular shape capable of passing through both the opening 411 and the variable-shaped opening 421 is written in a writing region of the target workpiece 340 mounted on the stage continuously moving. This method of writing or "forming" a given shape by letting beams pass through both the opening 411 and the variable-shaped opening 421 is referred to as a "variable shaping" method.

In performing electron beam writing, first a layout of a semiconductor integrated circuit is designed, and layout data (design data) for writing the design is generated. Then, the layout data is converted to generate writing data to be input into an electron beam pattern writing apparatus. The writing data is converted in the writing apparatus into shot data of a format used in the apparatus, to write each figure.

Generally, in order to enhance the data processing efficiency, a distributed processing is carried out, namely a writing region where patterns are arranged is divided into a plurality of small regions so that data can be distributed to each small region and data processing can be performed in each region. For example, a frame obtained by dividing the writing region into strip-like regions or a block obtained by further dividing the frame is used as a small region. A pattern is usually defined by one of the small regions to which the reference position of the pattern belongs. However, when it is necessary to arrange a pattern (ex. a cell) which extends over or "gets astride" small regions, if the pattern is defined by only one of the small regions which the pattern extends over, even if the distributed processing is performed, independency of the data processing of each small region will be deteriorated. Therefore, conventionally, the cell is previously divided not to protrude from the small region, to generate layout data. In that case, one cell is divided to be defined by each small region. Thus, two or more data is needed for the cell. As a result, there is a problem that the amount of layout data increases.

When there is a cell which can be formed by an array structure and a part (or all the elements) of the cell extends over another small region, it is normally supposed to take the following countermeasures. That is, an array development needs to be performed so that each cell may be defined by each small region in which the cell is to be arranged. Therefore, two or more data concerning the cell is needed, and thus the amount of layout data increases.

If the amount of layout data, especially at the upstream side, increases in the data conversion processing as stated above, time required for the conversion will increase when converting from the layout data into writing data. Furthermore, there is another problem that time required for transmitting the data to the next processing apparatus becomes huge amount of time. While an amount of data increases with the high integration of LSI in recent years, such data amount increase at the upstream side will affect throughput of the pattern writing apparatus.

As to a pattern aside subfields obtained by dividing the main deflection region, which has the same width and angle as those of a frame, into further smaller regions, the following technique is disclosed: that is, converting a boundary position of a subfield on the basis of a pattern extending over the subfields so that the pattern may not extend over them (refer to, e.g., Japanese Unexamined Patent Publication No. 11-67648 (JP-A-11-67648)).

As mentioned above, in order to enhance the independency of data processing of each small region, when arranging a pattern (ex. cell) extending over small regions, it is needed to previously divide the cell not to protrude from the small region, to generate layout data. Therefore, as mentioned above, there is the problem that the amount of layout data increases. Regarding the increase of the data amount, it is preferable that the amount of data increases in a latter step as late as possible. Then, the method described below, which is not disclosed to the public, is attempted to solve this problem.

In this method, a cell extending over small regions is not cut in the generation step of layout data. Instead of cutting, when converting writing data inputted in a writing apparatus into data of a format used in the writing apparatus, data of the pattern extending over small regions is copied to the small region which is extended over by the pattern, and a pattern portion which cannot be deflected in its own small region of the pattern extending over small regions is deleted. By this method, the cell extending over small regions can be distributed to each of the small regions, in the pattern writing apparatus. As a result, it becomes unnecessary to perform dividing data in the state of layout data or writing data. By virtue of this structure, increasing the data amount can be postponed to the stage of the writing apparatus, which is the downstream side of the data processing, not at the stage of layout data. Therefore, the efficiency of the distributed processing at the upstream side can be improved. Moreover, independency of distributed processing of each small region can be enhanced in the data processing stage in the pattern writing apparatus.

In this case, if cells defined by a plurality of small regions do not exist at the same coordinates in the absolute coordinate system, it may cause writing errors, such as a pattern omission and a pattern multiple exposure. For example, when configuring a cluster as a new section in the cell, the following problem arises. When data processing in the cluster is performed in a small region to which the starting point of the cluster belongs, if the absolute coordinate systems of the cells multiply defined are not in accordance with each other, it may cause a cluster omission or a cluster multiple processing. As a result, the writing errors, such as a pattern omission and a pattern multiple exposure stated above may be generated.

Thus, a method for verifying data is expected to prevent writing errors caused by the absolute coordinate system of the cell copied in the data conversion step being shifted or by distribution leakage indicating not being copied from the first. Moreover, it is expected to reduce verification time even in performing the verification. However, such a method for verifying data has not been established yet.

BRIEF SUMMARY OF THE INVENTION

An object of the present invention is to provide a method for verifying data more easily and simply, and to provide a pattern writing apparatus applying the method.

In accordance with one aspect of the present invention, a data verification method for verifying writing data used for writing a cell pattern in a writing region of a target workpiece by using charged particle beams includes inputting the writing data for writing a plurality of cell patterns including at least one cell pattern in which an identifier is added to each of data defining the at least one cell pattern extending over at least two small regions in a plurality of small regions obtained by virtually dividing the writing region, extracting the at least one cell pattern to which the identifier is added from the plurality of cell patterns and outputting an error result when only one cell pattern is extracted.

In accordance with another aspect of the present invention, a charged particle beam writing apparatus includes an input unit configured to input writing data for writing a plurality of cell patterns including at least one cell pattern in which an identifier is added to each of data defining the at least one cell pattern extending over at least two small regions in a plurality of small regions obtained by virtually dividing a writing region, an extraction unit configured to extract the at least one cell pattern to which the identifier is added from the plurality of cell patterns, an output unit configured to output an error result when only one cell pattern is extracted, and a writing unit configured to write the plurality of cell patterns by irradiating a target workpiece with a charged particle beam, based on the writing data for which the error result is not output.

In accordance with another aspect of the present invention, a computer-readable recording medium storing a program to be executed by a computer, the program includes inputting, from a storage unit, writing data for writing a plurality of cell patterns including at least one cell pattern in which an identifier is added to each of data defining the at least one cell pattern extending over at least two small regions in a plurality of small regions obtained by virtually dividing a writing region of a target workpiece, extracting the at least one cell pattern to which the identifier is added from the plurality of cell patterns, and outputting an error result when only one cell pattern is extracted.

DETAILED DESCRIPTION OF THE INVENTION

In the following Embodiments, a structure utilizing an electron ray (electron beam) as an example of a charged particle ray (charged particle beam) will be described. The charged particle ray is not limited to the electron ray, but may be a beam using other charged particle, such as an ion beam.

Embodiment 1

Figure 1:
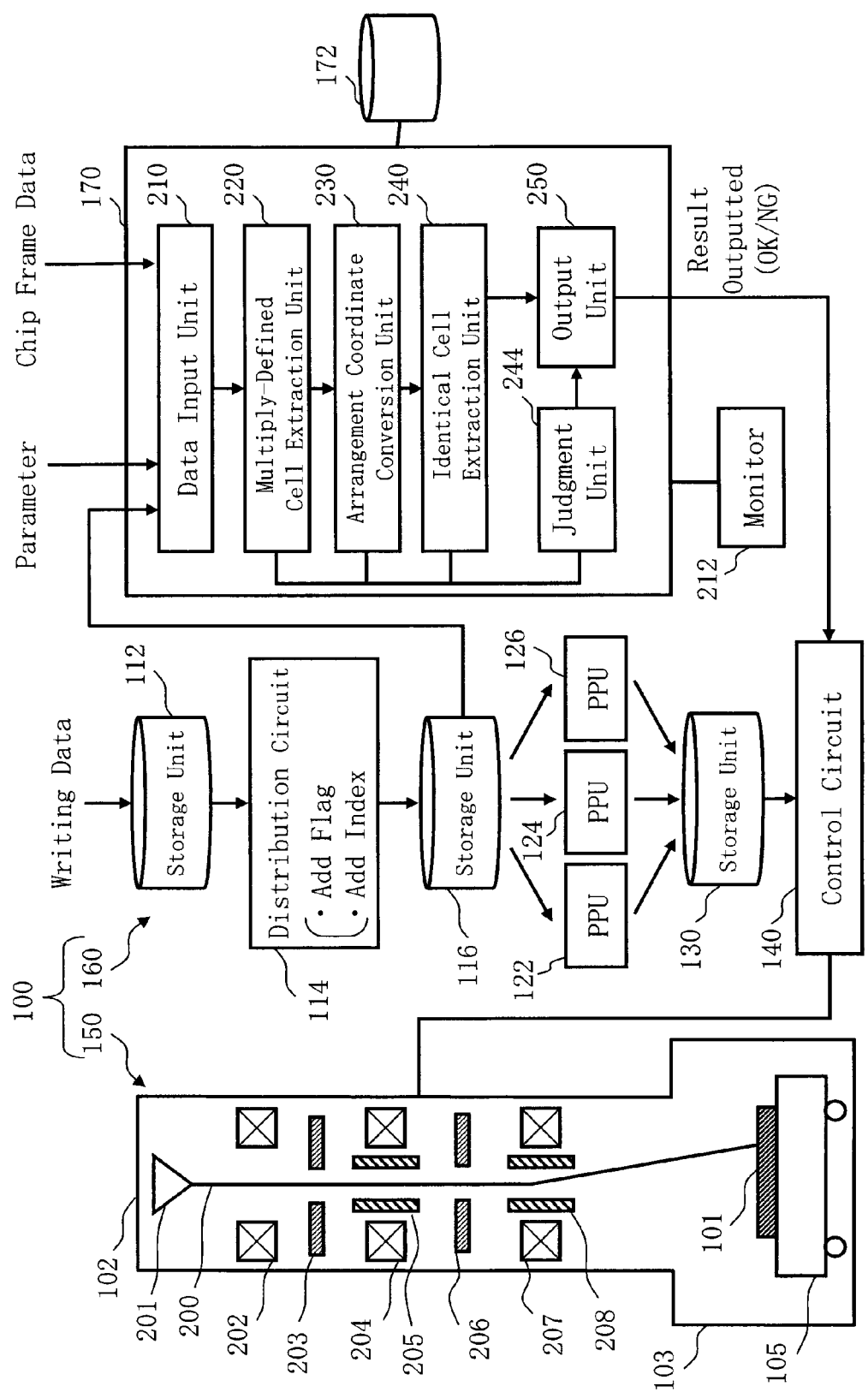
FIG. 1 is a schematic diagram showing an example of the main part structure of a pattern writing apparatus described in Embodiment 1.

FIG. 1 is a schematic diagram showing an example of the main part of a pattern writing apparatus according to Embodiment 1. In FIG. 1, a pattern writing apparatus 100 includes a writing unit 150 and a control unit 160. The pattern writing apparatus 100 serves as an example of a charged particle beam writing apparatus. The pattern writing apparatus 100 writes a pattern based on writing data, onto a target workpiece 101. The control unit 160 includes storage units 112, 116 and 130, a distribution circuit 114, parallel processing units (PPU) 122, 124 and 126, a control circuit 140, a data verification circuit 170, a storage unit 172, and a monitor 212. As the storage units 112, 116, 130 and 172, a magnetic disk unit, a memory, etc. can serve as them, for example. In the data verification circuit 170, there are arranged a data input unit 210, a multiply-defined cell extraction unit 220, an arrangement coordinate conversion unit 230, an identical cell extraction unit 240, a judgment unit 244, and an output unit 250. The writing unit 150 includes an electron lens barrel 102 and a writing chamber 103. In the electron lens barrel 102, there are arranged an electron gun assembly 201, an illumination lens 202, a first aperture plate 203, a projection lens 204, a deflector 205, a second aperture plate 206, an objective lens 207, and a deflector 208. In the writing chamber 103, there is an XY stage 105 which is movably arranged. On the XY stage 105, there is placed the target workpiece 101. As the target workpiece 101, for example, an exposure mask for exposing or "transferring and printing" a pattern onto a wafer is included. This mask includes a mask blank in which no patterns are formed, for example. While only the structure elements necessary for explaining Embodiment 1 are shown in FIG. 1, it should be understood that other structure elements generally necessary for the pattern writing apparatus 100 are also included.

Each structure, such as the data input unit 210, the multiply-defined cell extraction unit 220, the arrangement coordinate conversion unit 230, the identical cell extraction unit 240, the index judgment unit 244, and the output unit 250 may be configured by hardware, such as an electric circuit. Alternatively, it may be configured by software in which processing of each structure is executed by a computer (CPU). Furthermore, the processes may be executed by a combination between hardware of an electric circuit and software, or a combination of hardware and firmware. Moreover, a processing result of each structure is stored in the storage unit 172 each time, and read from it by other structure in the data verification circuit 170.

First, layout data (design data) is generated as mentioned above. Then, the layout data is converted to generate writing data to be input into the pattern writing apparatus 100. In the layout data, a plurality of cells (or called a cell pattern) are arranged on a chip. In each cell, one or more figures used as an element pattern constituting the cell are arranged. In the writing data, the writing region is classified into a plurality of serial internal structures: a chip layer, a frame layer obtained by virtually dividing a chip region to be a strip-like region in a certain direction, e.g. y direction, and in parallel to the writing surface, a block layer obtained by virtually dividing the frame region into regions of a predetermined size, a cell layer mentioned above, and a figure layer constituting the cell. In the present Embodiment, the frame mentioned above is used as a small region for distributed processing, for example, but it is not limited to the frame. For instance, it may be a block, and alternatively, other divided region may be the small region for the distributed processing.

The writing data is input into the pattern writing apparatus 100. First, the writing data is transmitted and stored in the storage unit 112. Then, the writing data is read from the storage unit 112 by the distribution circuit 114, and distributed to each small region. When distributed, the cell which extends over two or more small regions is copied so that it may be defined by all the small regions which the cell extends over. Moreover, in the distribution processing, a flag (identifier) is respectively added to the data of the cell extending over a plurality of small regions by the distribution circuit 114. Moreover, indexes (identifiers) being identical are added to the data of the identical cells composed of the same figure elements.

Figure 2:
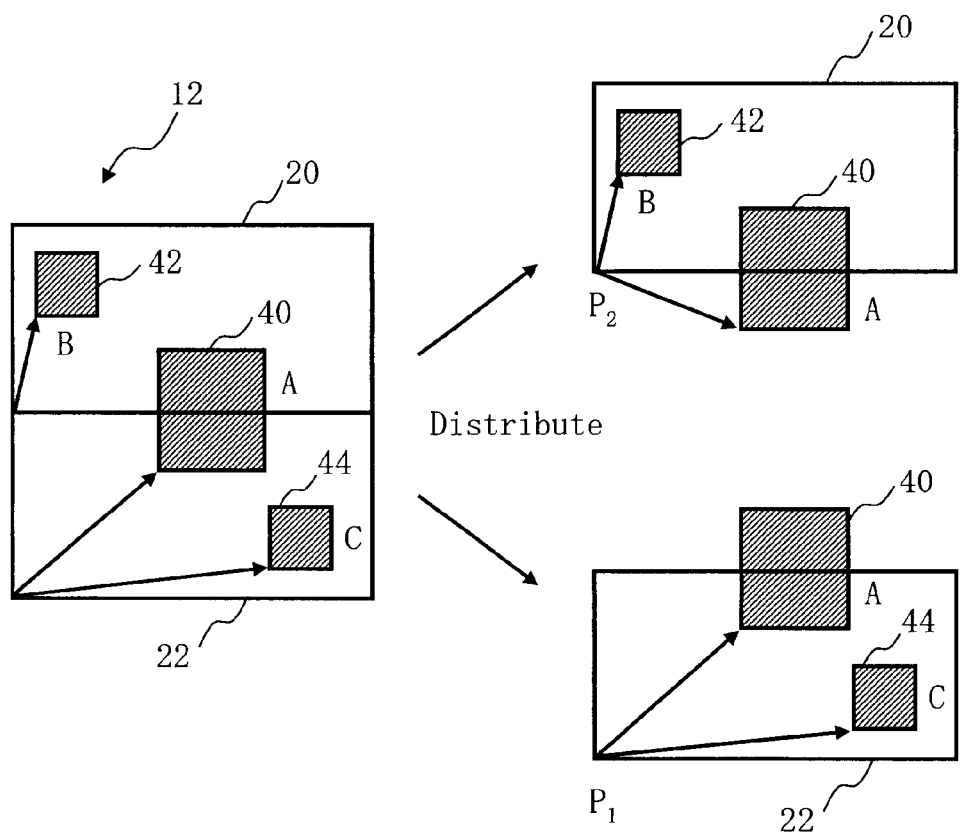
FIG. 2 shows an example of an arrangement structure of a cell described in Embodiment 1.

FIG. 2 shows an example of an arrangement structure of cells described in Embodiment 1. In FIG. 2, a cell 40 is arranged to extend over a frame 20 and a frame 22. The whole of a cell 42 is arranged in the frame 20, and the whole of a cell 44 is arranged in the frame 22. In the stage of writing data 12, since each cell is defined by one small region (a frame, herein), the cell 40 is defined by the frame 22 to which the reference position of the cell belongs. In this case, as a reference position of a cell, the position of the lower left apex of the cell is used, for example. It is acceptable to use other position as a reference position. In that case, it should be understood that the cell is defined by the frame to which the point regarded as the reference position belongs. Moreover, the cell 42 is defined by the frame 20 to which the reference position belongs. The cell 44 is defined by the frame 22 to which the reference position belongs. Moreover, the arrangement coordinate of the reference position of each cell is defined based on the reference position of the frame 22. Similarly to the case of a cell, as a reference position of a frame, the position of the lower left apex of the frame can be used. As mentioned above, it is acceptable to use other position as a reference position. In that case, it should be understood that the coordinate position of each cell is defined based on the point regarded as the reference position. Then, when the writing data 12 in the state above described is distributed to each frame by the distribution circuit 114, the cell 40 is defined by both the frames 20 and 22 as shown in FIG. 2.

Figure 3:
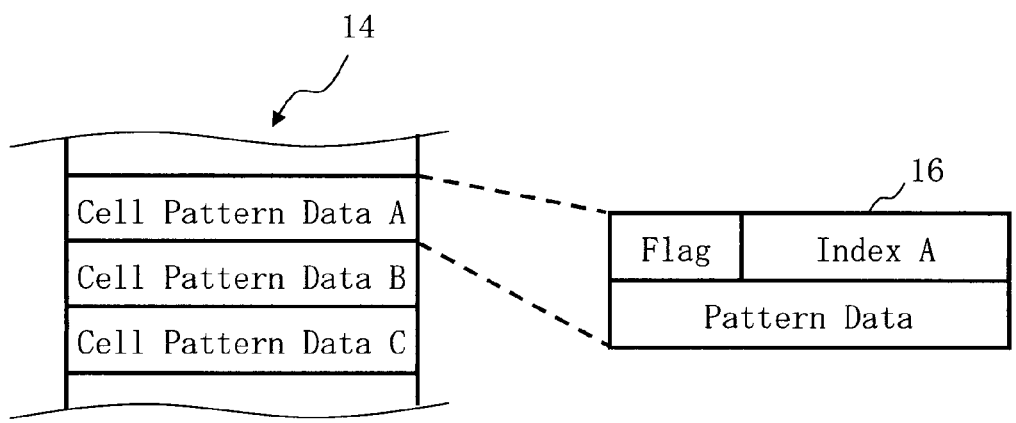
FIG. 3 shows an example of cell pattern data described in Embodiment 1.

FIG. 3 shows an example of cell pattern data described in Embodiment 1. The data of each cell is stored in the cell pattern data 14. In FIG. 3, there are shown a cell pattern data A indicating the data of the cell 40, a cell pattern data B indicating the data of the cell 42, and a cell pattern data C indicating the data of the cell 44. A flag and an index used as an example of an identifier are added to a cell pattern data 16 indicating the cell pattern data A of the cell which extends over a plurality of small regions.

The writing data which has been distributed as mentioned above is temporarily stored in the storage unit 116. Then, each frame of the writing data is sent to one of the PPUs 122, 124, and 126, and distributed processing is carried out in each frame. In the PPU, the writing data is converted into shot data of a format used in the apparatus. The converted shot data is stored in the storage unit 130.

When the writing data 12 is distributed to each frame by the distribution circuit 114, due to failure of processing, there may be a case wherein the cell extending over the frames is not copied to the frame which is extended over by the cell, or a case wherein a defined position becomes shifted even if copied. Thus, it may cause writing errors, such as a pattern omission and multiple exposure. Then, according to Embodiment 1, the data which has been distributed is verified in the data verification circuit 170.

Figure 4:
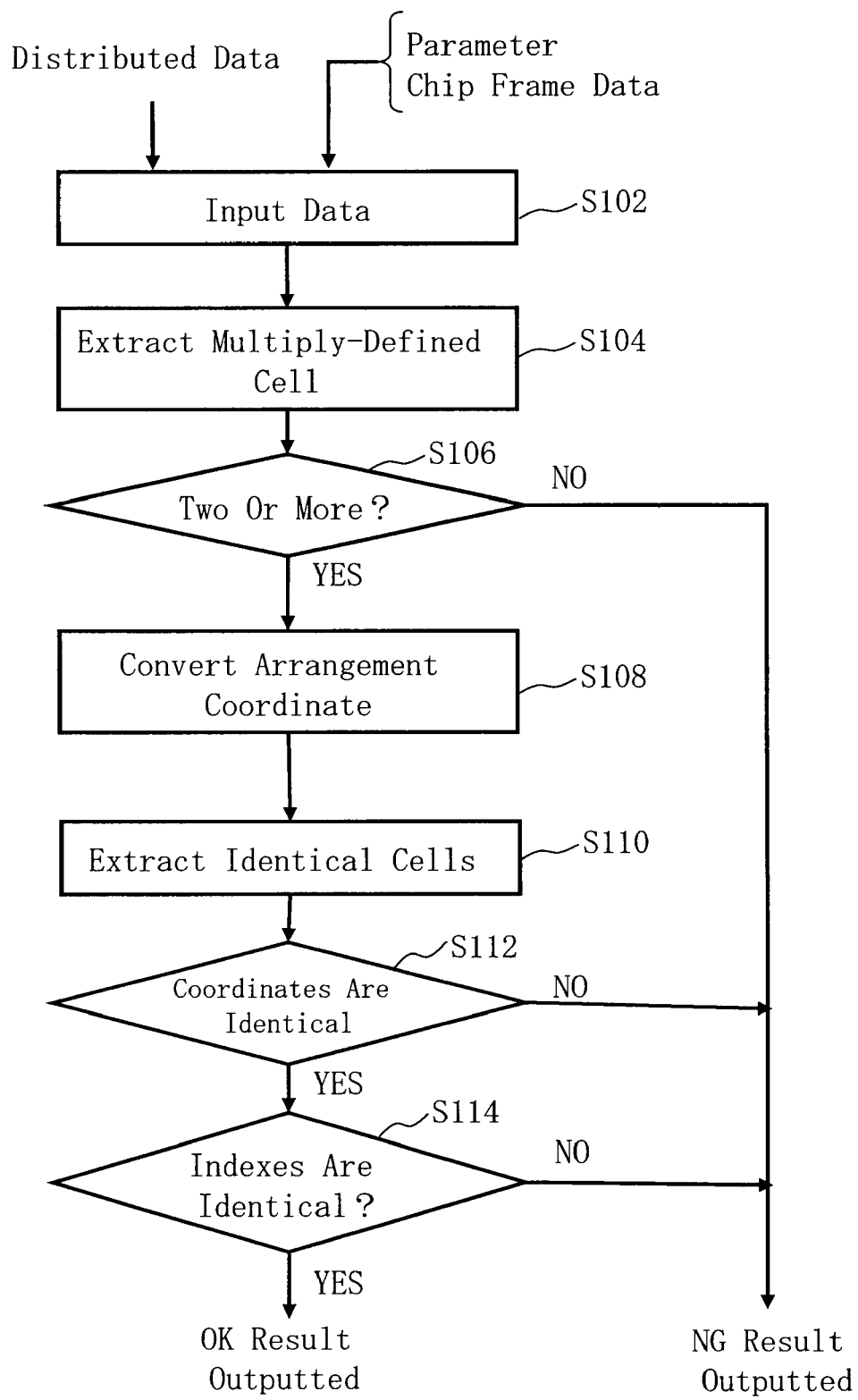
FIG. 4 is a flowchart showing the main steps of a data verification method described in Embodiment 1.

FIG. 4 is a flowchart showing the main steps of the method for verifying data described in Embodiment 1. First, as an input step (S102), the data input unit 210 inputs the writing data which has been distributed. The writing data can be read from the storage unit 116. This writing data is for writing a plurality of cells which include at least one cell with a flag added to each of the data defining at least one cell extending over at least two or more frames. For example, in the example of FIG. 2, the writing data is for writing the cell 40 extending over the frames and the other cells 42 and 44. In addition, parameters of frame margin data, etc., and chip frame data are also input.

Next, as an extraction step (S104), the multiply-defined cell extraction unit 220 extracts at least one cell to which the flag (an example of an identifier) mentioned above is added, from a plurality of cells. As to the example of FIG. 2, the cell 40 defined by the frame 20 and the cell 40 defined by the frame 22 correspond to the cell to which the flag is added.

With respect to other frames, if there is a cell which extends over a plurality of frames, it is extracted at this time.

Then, as a judgment step (S106), the judgment unit 244 judges whether two or more cells have been extracted or not. Since the cell extending over a plurality of frames should be defined by each frame which is extended over by the cell, a plurality of cells should be extracted. Therefore, when the number of the extracted cells is one, it means that an error of data processing has occurred.

Figure 5:
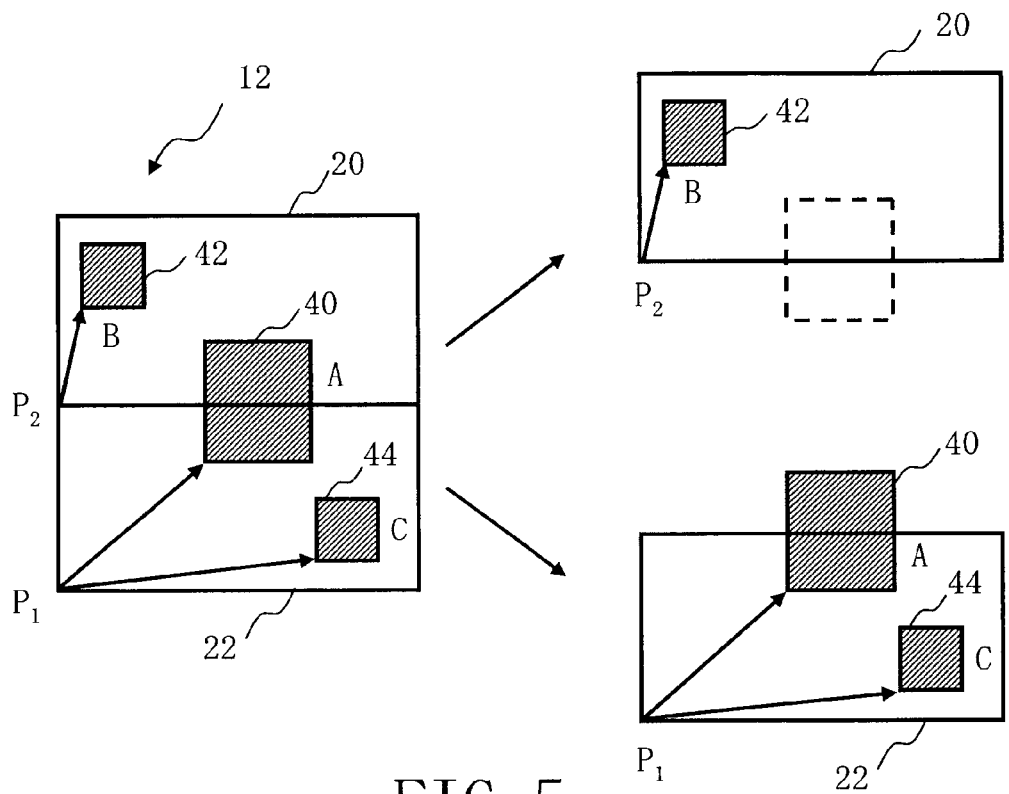
FIG. 5 shows an example of the case of a pattern omission being generated in Embodiment 1.

FIG. 5 shows an example of a pattern omission described in Embodiment 1. When the cell corresponding to the frame 20 and the frame 22 is distributed, the cell 40 should be defined by both the frames. However, if a processing error arises, there may be a case in which the cell 40 is not defined by the frame 20 as shown in FIG. 5. In that case, since the cell 40 which should have been defined by the frame 20 does not exist, a flag does not exist, either. Consequently, no flag is extracted. Then, when only one cell is extracted as this case, the output unit 250 outputs an error result (NG data) as an output step. The outputted error result is transmitted to the control circuit 140. In response to this, the control circuit 140 can stop the subsequent writing. Moreover, the error result is displayed on the monitor 212 to be checked by the user. Then, to further enhance the precision of the data verification, it is preferable to go to the next step.

Then, when a plurality of extracted cells exist, as an arrangement coordinate conversion step (S108), the arrangement coordinates of the extracted plural cells are respectively converted into arrangement coordinates based on the reference position of each writing region. Thus far, although the cell is defined based on a relative position with respect to the reference position of the frame, it is converted into the coordinate position in the absolute coordinate system at this time.

Figure 6:
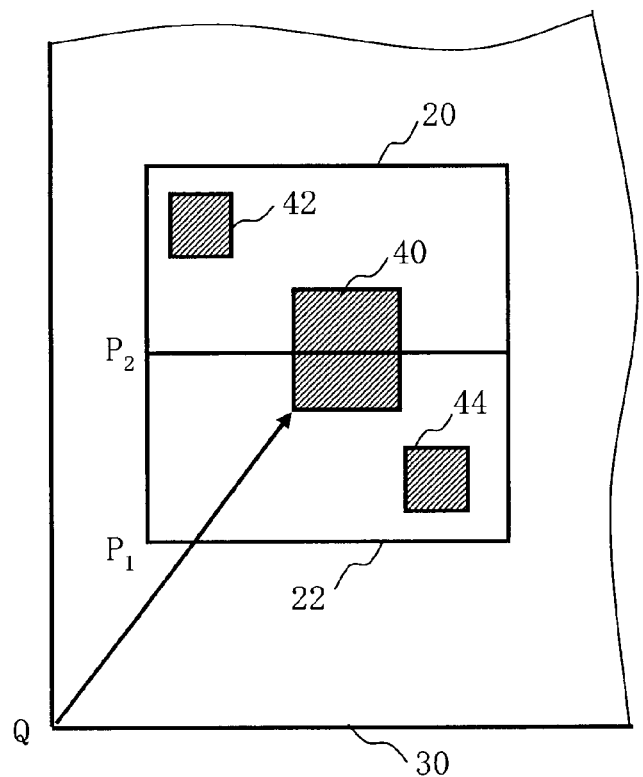
FIG. 6 shows an example of a cell defined by the absolute coordinate system described in Embodiment 1.

FIG. 6 shows an example of a cell defined by the absolute coordinate system described in Embodiment 1. In this case, the coordinate position of the cell 40 has been converted into the position based on the reference position Q of the writing region 30 serving as the absolute coordinate system. The writing region 30 herein may be the writing region of a mask substrate surface or may be a chip region. Generally, since a plurality of chips are arranged on one mask substrate, the absolute coordinate system can be formed in each chip. The absolute coordinate system of each chip is defined by chip frame data which the data input unit 210 inputted.

As a second extraction step (S110), the identical cell extraction unit 240 extracts a group of cells whose arrangement coordinates are identical, from a plurality of cells whose arrangement coordinates have been converted into the ones in the absolute coordinate system. In the case of FIG. 5, the cell 40 defined by the frame 20 and the cell 40 defined by the frame 22 become one group.

As a judgment step (S112), the judgment unit 244 judges whether a group of cells whose arrangement coordinates are identical in the absolute coordinate system has been extracted or not. If the arrangement position shifts at the time of the distribution processing, the arrangement coordinates are not in accordance with each other in the absolute coordinate system.

Figure 7:
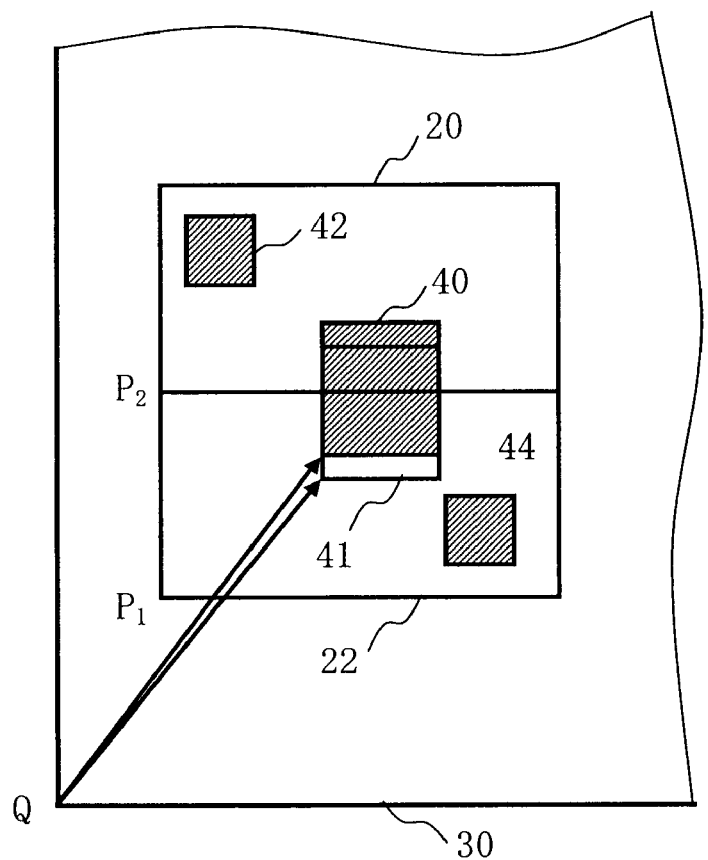
FIG. 7 shows an example of a cell defined shiftedly in the absolute coordinate system described in Embodiment 1.

FIG. 7 shows an example of a cell defined shiftedly in the absolute coordinate system described in Embodiment 1. If the arrangement position is shifted at the time of distribution processing, the coordinates deviate from the reference position Q of the writing region 30 as shown in FIG. 7. In FIG. 7, the shifted cell is shown as a cell 41. In that case, no group of cells whose arrangement coordinates are identical in the absolute coordinate system is extracted. Then, when no group of cells whose arrangement coordinates are identical in the absolute coordinate system exists, the output unit 250 outputs an error result (NG data) as a second output step. The outputted error result is transmitted to the control circuit 140. In response to this, the control circuit 140 can stop the subsequent writing. Moreover, the error result is displayed on the monitor 212 to be checked by the user. However, even if it is "OK" at this stage, there may be a case of extracting different cells whose arrangement coordinates in the absolute coordinate system are incidentally in accordance with each other. Then, to further enhance the precision of the data verification, it is preferable to go to the next step.

That is, when a group of cells whose arrangement coordinates are identical in the absolute coordinate system exists, as an index judgment step (S114), the judgment unit 244 judges an index (an example of a second identifier) added to each of the data of the cell in each group. If the cells are identical, identical indexes should be added to them. Therefore, if a group of cells whose indexes are different exists, it means that the cells are different from each other. Then, it turns out that a processing error has occurred at the time of distributing. When a group of cells whose indexes are different exists as this case, the output unit 250 outputs an error result (NG data) as a third output step. The outputted error result is transmitted to the control circuit 140. In response to this, the control circuit 140 can stop the subsequent writing. Moreover, the error result is displayed on the monitor 212 to be checked by the user. When no group of cells whose indexes are different exists, an OK result indicating that there is no error is output. The OK result is displayed on the monitor 212 to be checked by the user. By using the index, check processing for the internal structure elements becomes unnecessary, thereby improving the processing efficiency in the data verification.

By virtue of the structure described above, data verification can be performed, and furthermore, while performing writing, the data verification can be executed in real time.

Figure 8:
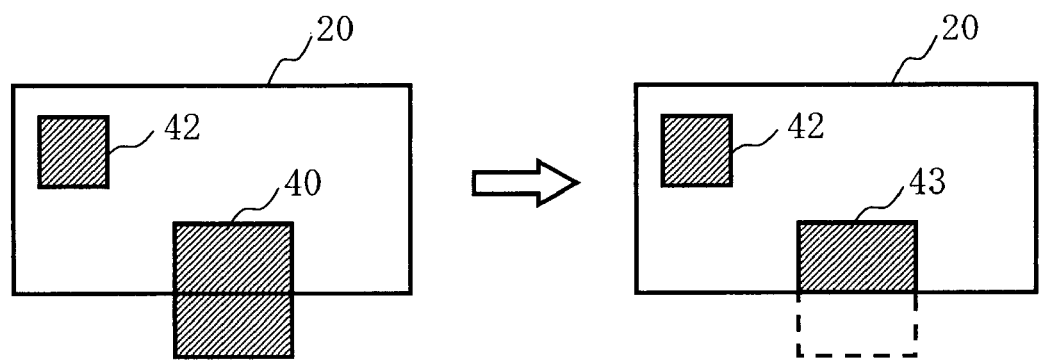
FIG. 8 illustrates processing of deleting a portion protruding from a frame described in Embodiment 1.

Now, it is returned to the processing of the writing operation. In the PPUs 122, 124, and 126, when converting the data of a cell into figure data of a format of the apparatus, a portion protruding from each frame is deleted. FIG. 8 illustrates the processing of deleting the portion protruding from the frame in Embodiment 1. For example, with respect to the cell 40 defined by the frame 20, the portion protruding from the region of the frame 20 is deleted because it belongs to a region of other frame. In the case of FIG. 8, a partial cell 43 is generated by the deleting. At the same time or later, in the PPUs 122, 124, and 126, the writing data is converted into figure data of a format used in the apparatus. The converted figure data is stored in the storage unit 130.

Using the figure data stored in the storage unit 130, the control circuit 140 controls the writing unit 150 to write a pattern on the target workpiece 101. Specifically, it is written as follows:

An electron beam 200 emitted from an electron gun assembly 201 irradiates the whole of a first aperture plate 203 having a rectangular opening or "hole" by an illumination lens 202, for example. This shape of the rectangular opening may also be a square, rhombus, a rhomboid, etc. At this point, the electron beam 200 is shaped to be a rectangle. Then, after having passed through the first aperture plate 203, the electron beam 200 of a first aperture image is projected onto a second aperture plate 206 by a projection lens 204. The position of the first aperture image on the second aperture plate 206 is controlled by a deflector 205, and thereby the shape and size of the beam can be changed. After having passed through the second aperture plate 206, the electron beam 200 of a second aperture image is focused by an objective lens 207 and deflected by a deflector 208, to reach a desired position on a target workpiece 101 placed on an XY stage 105.

By virtue of the structure described above, even when a cell extending over a plurality of small regions is defined by each small region, a data processing error can be easily and simply verified. Consequently, it is possible to avoid a writing error before it occurs.

Embodiment 2

Figure 9:
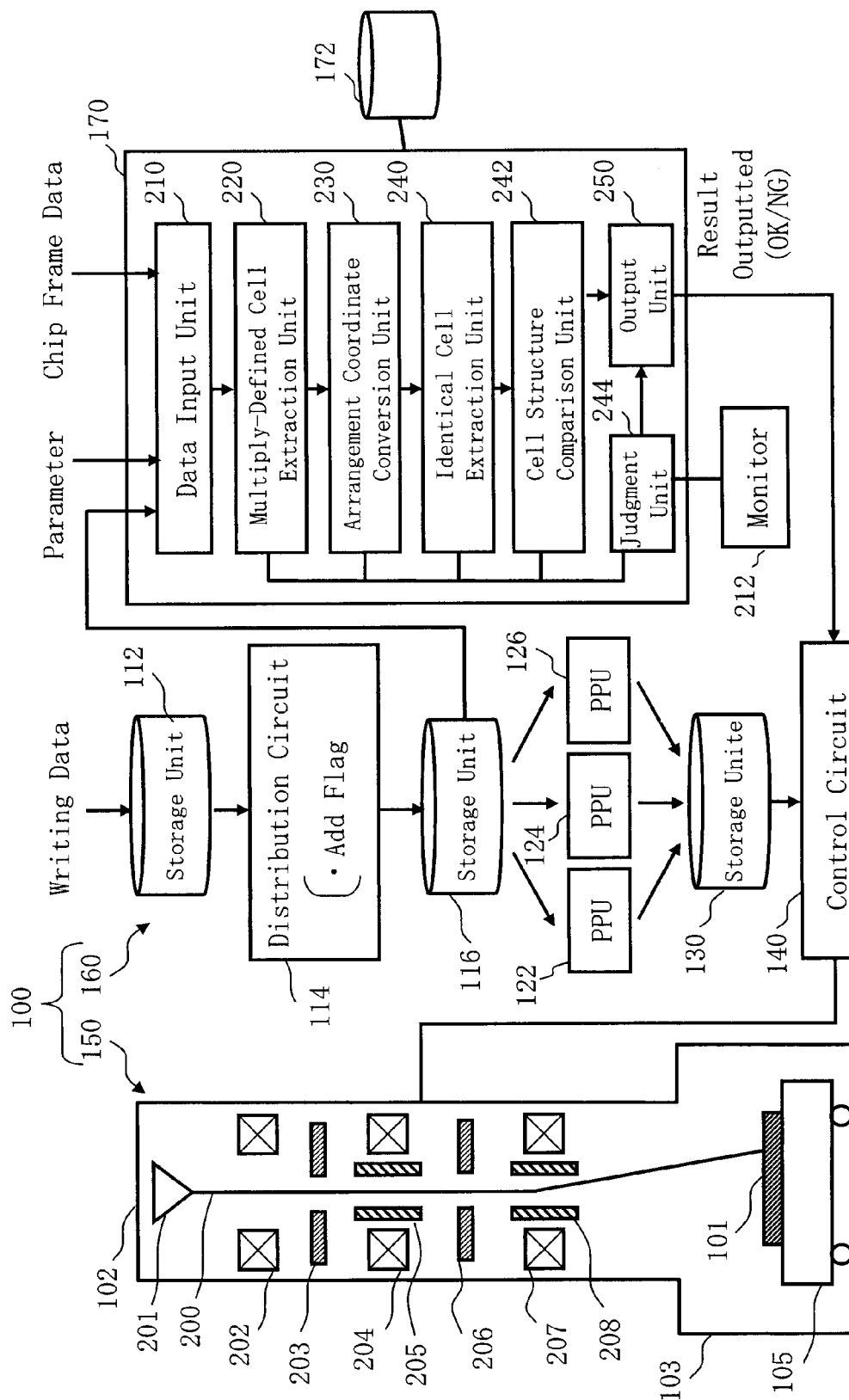
FIG. 9 is a schematic diagram showing an example of the main part structure of a pattern writing apparatus described in Embodiment 2.

In Embodiment 1, it is judged by using an index as an identifier whether cells are identical or not. In Embodiment 2, the case in which no index is added to the data of a cell will be described. FIG. 9 is a schematic diagram showing an example of the main part structure of a pattern writing apparatus described in Embodiment 2. The structure in FIG. 9 is the same as that of FIG. 1 other than a cell structure comparison unit 242 being further added. In Embodiment 2, similarly to FIG. 1, the structure element of the data verification circuit 170 may be configured by hardware, software, or a combination of hardware and software, and alternatively by a combination of hardware and firmware. The steps up to the identical cell extraction step are the same as those in Embodiment 1. However, the distribution circuit 114 does not add indexes.

Figure 10:
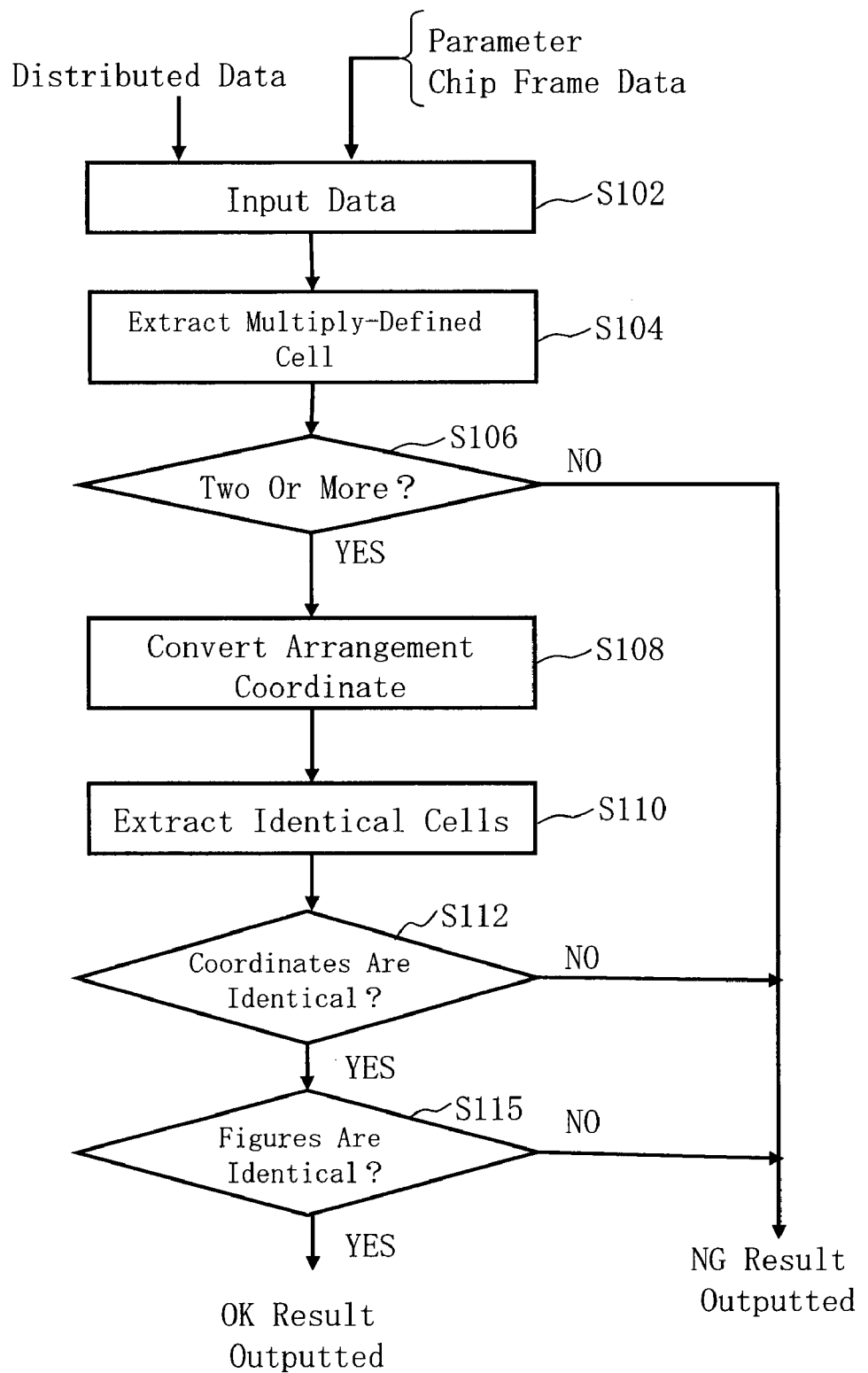
FIG. 10 is a flowchart showing the main steps of a data verification method described in Embodiment 2.

FIG. 10 is a flowchart showing the main steps of the method for verifying data in Embodiment 2. The steps from S102 to S112 are the same as those in Embodiment 1.

Figure 11:
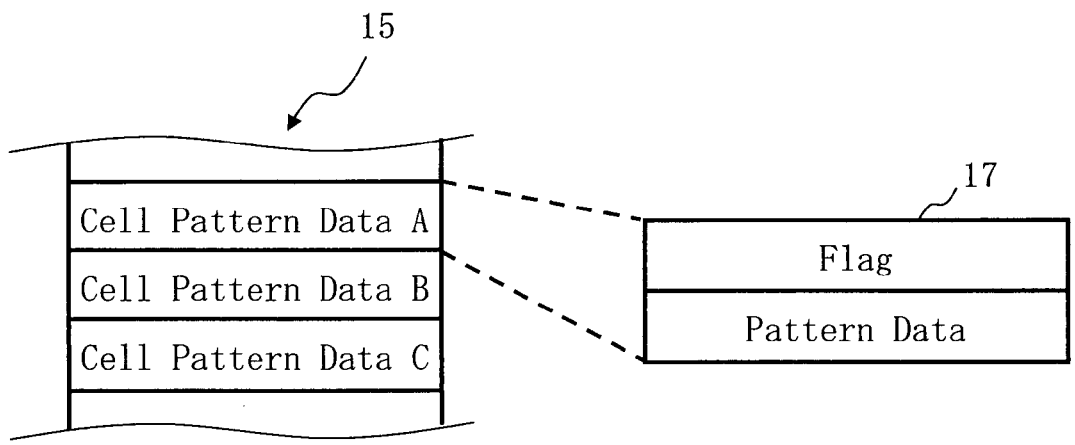
FIG. 11 shows an example of a cell pattern data described in Embodiment 2.

FIG. 11 shows an example of a cell pattern data described in Embodiment 2. Data of each cell is stored in the cell pattern data 15. FIG. 11 shows the cell pattern data A indicating the data of the cell 40, the cell pattern data B indicating the data of the cell 42, and the cell pattern data C indicating the data of the cell 44. A flag is added to a cell pattern data 17 of the cell extending over a plurality of small regions.

If this state is kept, it is impossible to judge whether cells are identical or not even if a group of cells whose arrangement coordinates are in accordance with each other in the absolute coordinate system exists. Then, according to Embodiment 2, as a comparison step (S115), the cell structure comparison unit 242 compares to know whether at least one figure element constituting each cell of the group of cells, whose arrangement coordinates are in accordance with each other in the absolute coordinate system, is identical with each other or not.

Figure 12:
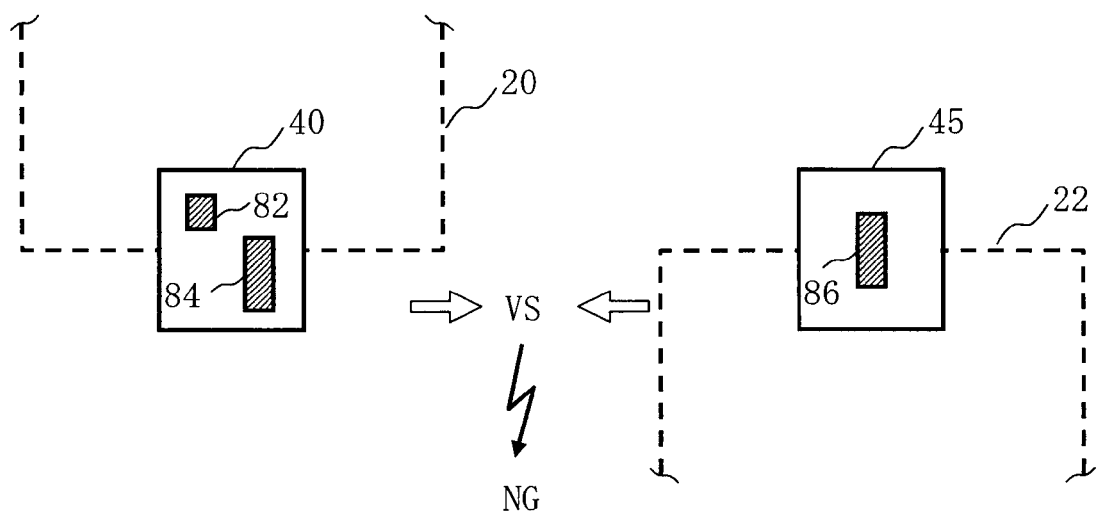
FIG. 12 illustrates processing of comparing figures in a cell described in Embodiment 2.

FIG. 12 illustrates a processing for comparing figures in the cells in Embodiment 2. In the case of FIG. 12, the cell 40 defined by the frame 20 is composed of FIGS. 82 and 84. On the other hand, a cell 45 defined by the frame 22 is composed of a FIG. 86. When compared, it is concluded that the figure elements do not accord with each other. In other words, if no figure elements of cells are identical in a plurality of cells whose arrangement coordinates are in accordance with each other in the absolute coordinate system, it is concluded that the cells are "not identical." Then, when a group of identical cells does not exist as a result of the comparing, the output unit 250 outputs an error result as an output step. The outputted error result is transmitted to the control circuit 140. In response to this, the control circuit 140 can stop the subsequent writing. Moreover, the error result is displayed on the monitor 212 to be checked by the user. When a group of cells not being identical does not exist, an OK result indicating that there is no error is output. The OK result is displayed on the monitor 212 to be checked by the user.

By virtue of the structure described above, even when indexes are not added, a data processing error can be easily and simply verified. Consequently, it is possible to avoid a writing error before it occurs.

Embodiment 3

In Embodiments 1 and 2, data is verified using writing data that has not been converted by the PPU. Particularly, in Embodiment 2, since verification is performed before the PPU deletes a cell portion protruding from a frame region, it is possible to compare whether internal structures of cells are identical or not. On the other hand, Embodiment 3 describes a method for verifying data after deleting a cell portion protruding from the frame region by using the PPU.

Figure 13:
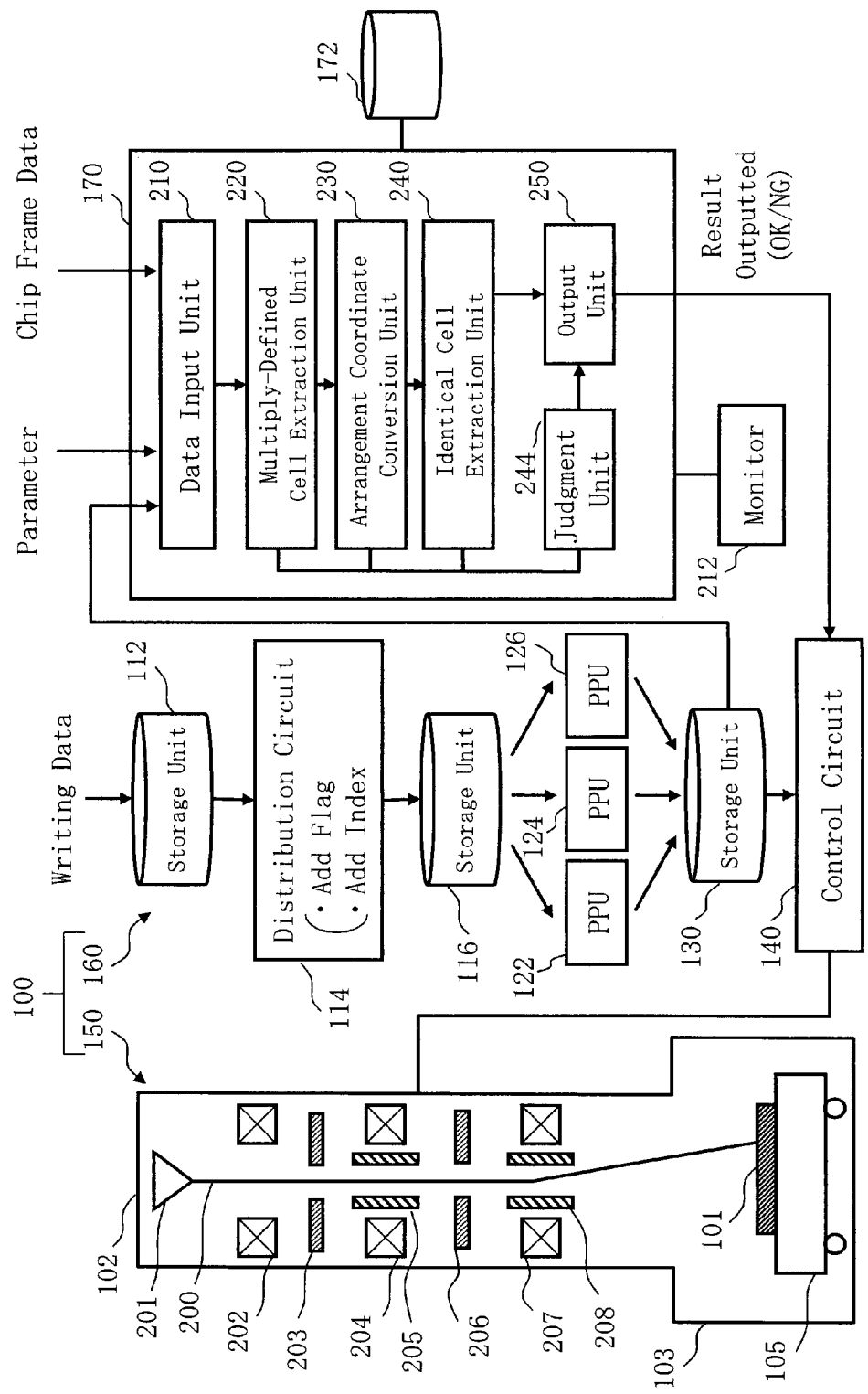
FIG. 13 is a schematic diagram showing an example of the main part structure of a pattern writing apparatus described in Embodiment 3.

FIG. 13 is a schematic diagram showing an example of the main part structure of a pattern writing apparatus described in Embodiment 3. The structure in FIG. 13 is the same as that of FIG. 1 other than that the data verification circuit 170 inputs data from the storage unit 130. Moreover, the flowchart of the method for verifying data is also the same as that of FIG. 4. Others are the same as those in Embodiment 1 other than that the data verification circuit 170 inputs data from the storage unit 130. Even if a cell portion protruding from a frame region is deleted by the PPU, since identical indexes (an example of an identifier) have already been added to the data whose origin is the same cell, data can be verified by judging the indexes as well as Embodiment 1.

Figure 14:
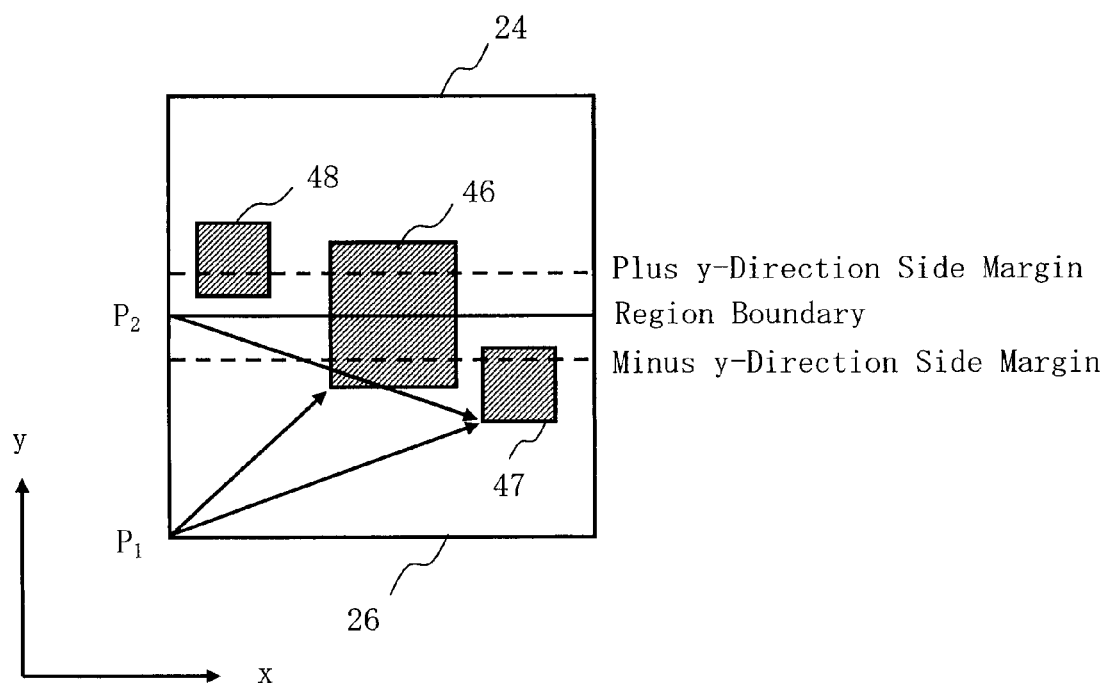
FIG. 14 shows the case in which a cell extends over a frame having a margin region.

In each of Embodiments mentioned above, it is also acceptable to use the method described below for judging whether a cell extends over a plurality of frames or not. In Embodiments 1 to 3 mentioned above, a multiple definition flag is added to a cell extending over a frame boundary (line). However, the multiple definition flag may also be added to a cell which extends over a band including a margin in addition to the boundary. FIG. 14 shows the case of a cell extending over a frame in which a margin region is formed. Usually, a margin region is provided in each frame. Therefore, it is acceptable to consider the margin when judging whether the cell extending over or not. For example, a cell 46 extends over the region boundary of the original frame regardless of the margin. In this case, the method described in each Embodiment can be applied. On the other hand, with respect to a cell 47, a part of it is included in the margin region formed at the minus y-direction side of the frame 24. Moreover, with respect to a cell 48, a part of it is included in the margin region formed at the plus y-direction side of the frame 26. In these cases, namely the case of the cell extending over only the margin region, it is enough to decide whether the cell needs to be multiply distributed or not, based on where the boundary line is set up at the time of deleting a portion protruding from the region by the PPU. For example, when the pattern writing apparatus 100 sets up the boundary line to include the minus y-direction side margin, what is necessary is to distribute the cell 47 to both the frames. In that case, it is needless to say that a flag and an index are added to the data of the cell 47. Alternatively, for example, when the pattern writing apparatus 100 sets up the boundary line to include the plus y-direction side margin, what is necessary is to distribute the cell 48 to both the frames. In that case, it is also needless to say that a flag and an index are added to the data of the cell 48. As information on the margin, the information inputted by the data input unit 210 as a parameter can be used.

In the above description, what is represented as "... unit", "... part" or "... step" can be configured by computer programs. They may be implemented by software programs executed by the computer system, or alternatively by any combination of software, hardware and/or firmware. When constituted by a program, the program is stored in a computer-readable recording medium, such as a magnetic disk drive, magnetic tape drive, FD, CD, DVD, MO or ROM.

Figure 15:
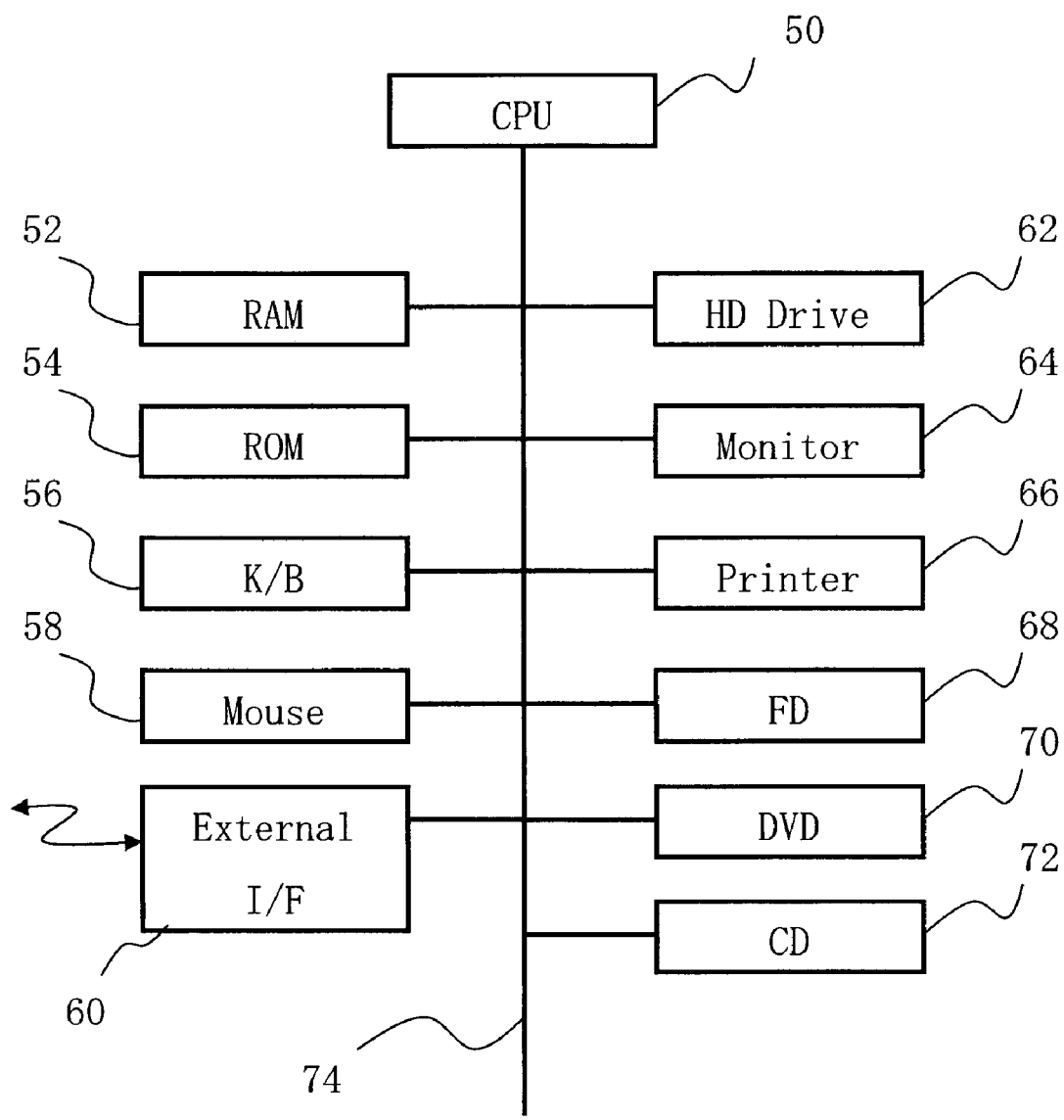
FIG. 15 is a block diagram showing an example of a hardware structure when configured by a program.
Figure 16:
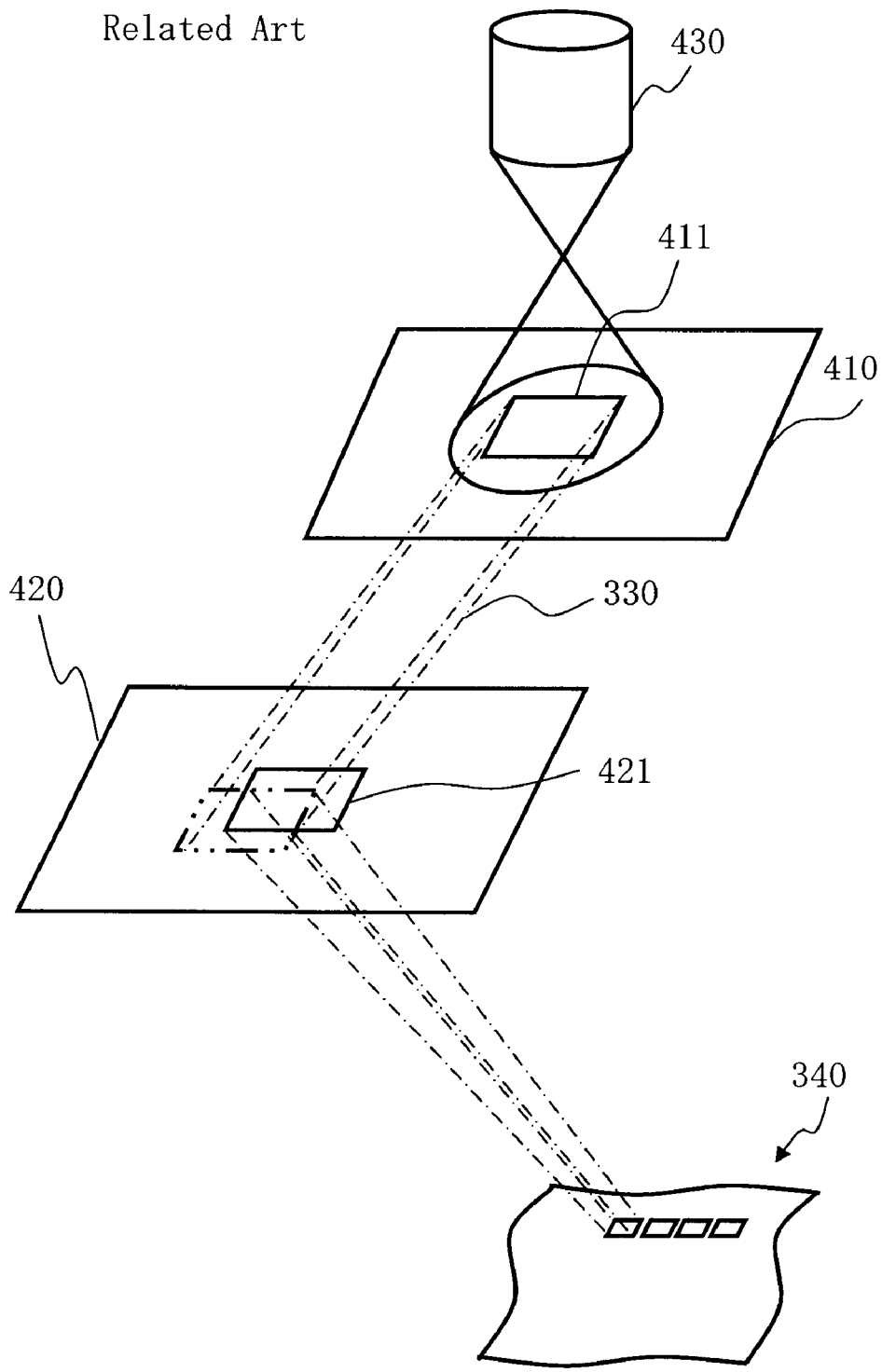
FIG. 16 shows a schematic diagram illustrating operations of a variable-shaped type electron beam writing apparatus.

FIG. 15 is a block diagram showing an example of a hardware structure when configured by a program. A CPU 50 being a computer is connected, through a bus 74, to a RAM (Random Access Memory) 52, ROM 54, magnetic disk (HD) drive 62, keyboard (K/B) 56, mouse 58, external interface (I/F) 60, monitor 64, printer 66, FD 68, DVD 70, and CD 72. The RAM 52, ROM 54, magnetic disk (HD) drive 62, FD 68, DVD 70, and CD 72 are examples of a storage unit. The keyboard (K/B) 56, mouse 58, external interface (I/F) 60, FD 68, DVD 70, and CD 72 are examples of input means. The external interface (I/F) 60, monitor 64, printer 66, FD 68, DVD 70, and CD 72 are examples of output means.

While the embodiments have been described above with reference to specific examples, the present invention is not restricted to these specific examples. For example, cells are mainly described as a pattern in each Embodiment, but it is not limited thereto. A pattern of other classified data may also be used. For example, a figure and a cluster can be used. Moreover, as a matter of course, not only a cell extending over two small regions but also a cell extending over three or more small regions can be applied. In Embodiment 3, although flags and indexes are added by the distribution circuit 114, it is also acceptable to configure as follows: Indexes are previously added to writing data, and each of the PPUs 122, 124, and 126, doubling the function of the distribution circuit 114, virtually distributes the writing data to each small region and reads each of the distributed data from the storage unit 112. Then, when reading the writing data, a flag (identifier) is respectively added to the data of a cell which extends over a plurality of small regions. The data input unit 210 inputs the data, to which a flag and an index are added and whose operation processing has already been finished, from each of the PPUs 122, 124, and 126. The same effect can be acquired even when constituted as just mentioned above. With this structure, the distribution circuit 114 and the storage unit 116 are omissible.

Moreover, it is also acceptable to arrange the data verification circuit 170, the storage unit 172, etc. not inside the pattern writing apparatus 100 but outside it, as an off-line unit. In that case, what is necessary is just to input data which has already been distributed. It is also preferable to configure the data verification circuit 170 as an independent data verification apparatus.

While description of the apparatus structure, control method, etc. not directly required for explaining the present invention is omitted, it is possible to suitably select and use some or all of them when needed. For example, although the structure of a control unit for controlling the pattern writing apparatus 100 is not described, it should be understood that a necessary control unit structure can be selected and used appropriately.

In addition, any other method for verifying data and an apparatus thereof, and a writing apparatus using charged particle beams and a method therefor that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A data verification method for verifying writing data used to write a cell pattern in a writing region of a target workpiece by using charged particle beams, comprising:
   inputting, with an electric circuit or a computer, the writing data for writing a plurality of cell patterns including at least one cell pattern extending over at least two small regions in a plurality of small regions obtained by virtually dividing the writing region, wherein the writing data for each small region over which the at least one cell pattern extends includes a copy of the cell pattern data and an identifier associated with the cell pattern data;
   extracting, with the electric circuit or the computer, the at least one cell pattern with which the identifier is associated from the plurality of cell patterns; and
   outputting, with the electric circuit or the computer, an error result when only one cell pattern is extracted.

2. The method according to claim 1, wherein a first arrangement coordinates of each of the plurality of cell patterns is defined based on a reference position of a small region in which the each itself is arranged, in the plurality of small regions, the method further comprising:
   converting, when a plurality of cell patterns are extracted, the first arrangement coordinates of each of the plurality of cell patterns extracted into a second arrangement coordinates based on a reference position of the writing region;
   extracting a group of cell patterns whose second arrangement coordinates accord with each other, from the plurality of cell patterns whose arrangement coordinates have been converted into the second arrangement coordinates; and
   outputting an error result when the group of cell patterns whose second arrangement coordinates accord with each other does not exist.

3. The method according to claim 2, wherein the cell pattern is composed of at least one figure element, a second identifier is added to each of data of identical cell patterns composed of the same figure element, the method further comprising:
   outputting an error result when the group of cell patterns whose second arrangement coordinates accord with each other exists and when a group of cell patterns to which different second identifiers are added exists in the group of cell patterns whose second arrangement coordinates accord with each other, and outputting a result indicating no error when the group of cell patterns to which different second identifiers are added does not exit in the group of cell patterns whose second arrangement coordinates accord with each other.

4. The method according to claim 2, wherein the cell pattern is composed of at least one figure element, the method further comprising:
   comparing, when the group of cell patterns whose second arrangement coordinates accord with each other exists, to find whether the at least one figure element composing each cell pattern of the group of cell patterns accords with each other; and
   outputting an error result as a result of the comparing when a group of cell patterns whose the at least one figure element does not accord with each other exists, and outputting a result indicating no error when the group of cell patterns whose the at least one figure element does not accord with each other does not exist.

5. The method according to claim 1, wherein a flag is used as the identifier.

6. The method according to claim 1, wherein an index is used as the identifier.

7. The method according to claim 3, wherein an index is used as the second identifier.

8. A charged particle beam writing apparatus, comprising:
   an input unit configured to input writing data to write a plurality of cell patterns including at least one cell pattern extending over at least two small regions in a plurality of small regions obtained by virtually dividing a writing region, wherein the writing data for each small region over which the at least one cell pattern extends includes a copy of the cell pattern data and an identifier associated with the cell pattern data;
   an extraction unit configured to extract the at least one cell pattern with which the identifier is associated from the plurality of cell patterns;
   an output unit configured to output an error result when only one cell pattern is extracted; and
   a writing unit configured to write the plurality of cell patterns by irradiating a target workpiece with a charged particle beam, based on the writing data for which the error result is not output.

9. The apparatus according to claim 8, wherein a first arrangement coordinates of each of the plurality of cell patterns is defined based on a reference position of a small region in which the each itself is arranged, in the plurality of small regions, the apparatus further comprising:
   an arrangement coordinates conversion unit configured, when a plurality of cell patterns are extracted, to convert the first arrangement coordinates of each of the plurality of cell patterns extracted into a second arrangement coordinates based on a reference position of the writing region; and
   a second extraction unit configured to extract a group of cell patterns whose second arrangement coordinates accord with each other, from the plurality of cell patterns whose arrangement coordinates have been converted into the second arrangement coordinates, wherein
   the output unit outputs an error result when the group of cell patterns whose second arrangement coordinates accord with each other does not exist.

10. The apparatus according to claim 9, wherein the cell pattern is composed of at least one figure element, a second identifier is added to each of data of identical cell patterns composed of the same figure element, and the output unit outputs an error result when the group of cell patterns whose second arrangement coordinates accord with each other exists and when a group of cell patterns to which different second identifiers are added exists in the group of cell patterns whose second arrangement coordinates accord with each other, and output a result indicating no error when the group of cell pattern to which different second identifiers are added does not exit in the group of cell patterns whose second arrangement coordinates accord with each other.

11. The apparatus according to claim 9, wherein the cell pattern is composed of at least one figure element, the apparatus further comprising:
   a comparison unit configured, when the group of cell patterns whose second arrangement coordinates accord with each other exists, to compare to find whether the at least one figure element composing each cell pattern of the group of cell patterns accords with each other, wherein
   the output unit outputs an error result as a result of the comparing when a group of cell patterns whose the at least one figure element does not accord with each other exists, and outputs a result indicating no error when the group of cell patterns whose the at least one figure element does not accord with each other does not exist.

12. The apparatus according to claim 8, wherein a flag is used as the identifier.

13. The apparatus according to claim 8, wherein an index is used as the identifier.

14. The apparatus according to claim 10, wherein an index is used as the second identifier.

15. A non-transitory computer-readable recording medium storing a program to be executed by a computer, the program comprising:
   inputting, from a storage unit, writing data to write a plurality of cell patterns including at least one cell pattern extending over at least two small regions in a plurality of small regions obtained by virtually dividing a writing region of a target workpiece, wherein the writing data for each small region over which the at least one cell pattern extends includes a copy of the cell pattern data and an identifier associated with the cell pattern data;
   extracting the at least one cell pattern with which the identifier is associated from the plurality of cell patterns; and
   outputting an error result when only one cell pattern is extracted.

* * * * *